United States Patent [19]
Katsuoka et al.

[11] Patent Number: 5,584,930
[45] Date of Patent: Dec. 17, 1996

[54] METHOD FOR MEASURING THE DIAMETER OF A SINGLE CRYSTAL INGOT

[75] Inventors: Nobuo Katsuoka, Takasaki; Yoshihiro Hirano, Annaka; Atsushi Ozaki, Annaka; Masahiko Baba, Annaka, all of Japan

[73] Assignee: Shin-Etsu Handotai Co., Ltd., Japan

[21] Appl. No.: 487,507

[22] Filed: Jun. 7, 1995

Related U.S. Application Data

[63] Continuation of Ser. No. 377,688, Jan. 25, 1995, abandoned, which is a continuation of Ser. No. 59,432, May 4, 1993, abandoned, which is a continuation of Ser. No. 829,964, Feb. 3, 1992, abandoned.

[30] Foreign Application Priority Data

Feb. 8, 1991 [JP] Japan ................... 3-037894

[51] Int. Cl.⁶ .................................................. C30B 15/20
[52] U.S. Cl. ...................... 117/14; 117/13; 117/201
[58] Field of Search ........................... 117/13, 14, 29, 117/201, 202, 203, 208, 222

[56] References Cited

U.S. PATENT DOCUMENTS

| | | | |
|---|---|---|---|
| 3,493,770 | 2/1970 | Dessauer et al. | 156/601 |
| 3,692,499 | 9/1972 | Andrychuk | 156/601 |
| 4,539,067 | 9/1985 | Washizuka et al. | 156/601 |
| 4,565,598 | 1/1986 | Seymour | 156/601 |
| 4,591,994 | 5/1986 | Washizuka et al. | 156/601 |
| 4,915,775 | 4/1990 | Katsuoka et al. | 156/601 |
| 4,916,955 | 4/1990 | Katsuoka et al. | 422/249 |
| 4,926,357 | 5/1990 | Katsuoka et al. | 156/601 |
| 4,973,377 | 11/1990 | Katsuoka et al. | 156/618.1 |

*Primary Examiner*—R. Bruce Breneman
*Assistant Examiner*—FeLisa Garrett
*Attorney, Agent, or Firm*—Whitham, Curtis, Whitham & McGinn

[57] ABSTRACT

A method for measuring a diameter of a single crystal ingot pulled up in a single crystal pulling apparatus comprising: calculating the weight of the pulled-up single crystal, calculating the descent amount of the melt surface relative to the crucible wall from the calculated pulled-up weight of the grown single crystal, and then either correcting the value of the ingot diameter actually measured by the optical sensor in response to the descent amount of the melt surface level or raising the crucible by an amount equal to the descent amount of the surface level.

11 Claims, 2 Drawing Sheets

METHOD FOR MEASURING THE DIAMETER OF A SINGLE CRYSTAL INGOT

This application is a continuation of application Ser. No. 08/377,688, now abandoned filed Jan. 25, 1995, which is a continuation of application Ser. No. 08/059,432 filed May 4, 1993, now abandoned which is a continuation of 07/829,964 filed on Feb. 3, 1992 now abandoned.

BACKGROUND OF THE INVENTION

The present invention relates to a method for measuring a diameter of a single crystal ingot which is an ingot grown and pulled up from a molten liquid of a polycrystal substance in a single crystal pulling apparatus in accordance with the Czochralski (CZ) method.

The single crystal pulling apparatus is an apparatus for growing and pulling up a single crystal ingot from a molten polycrystal substance. This apparatus comprises a main chamber wherein the single crystal is grown, and in this main chamber are housed a crucible for containing the polycrystal substance, a heater arranged to surround the crucible, and a heat insulator arranged to surround the heater. Beneath the main chamber are provided mechanisms for rotating the crucible about the center line thereof to control the uniformity of the heat flux in the molten polycrystal substance during the crystal growing process. Rising above the main chamber is a towering structure of a crystal pull chamber which is an upright, substantially cylindrical enclosure terminating in an upper structure of a crystal pulling mechanism. The single crystal ingot which is grown and raised high in the main chamber is brought up into the pull chamber.

In the single crystal pulling apparatus, the single crystal is caused to grow from the lower tip of a seed crystal which is attached to the lower end of a pull device such as a wire and which is dipped in a polycrystal substance such as silicon that is melted down by the heater. As the seed crystal is rotated and brought up higher slowly, the desired single crystal is grown longer from the seed tip, and the diameter of the single crystal gets larger as the length of the the single crystal increases until the diameter becomes a predetermined size. Thus, the head portion of the single crystal ingot becomes conical in shape and the main body portion becomes cylindrical. The portion of the ingot where the conical head portion turns cylindrical is called shoulder portion. The main purpose of measuring the diameter of the growing ingot is to maintain the diameters of the cylindrical portion as close to the predetermined size as possible to thereby obtain an ingot of uniform diameter.

The diameter of the growing single crystal ingot at the solid-liquid interface is measured in a real time manner by means of an optical sensor such as an image sensor, ITV, and the like. In order to obtain accurate values of the diameter of the single crystal ingot, it is necessary that the distance between the head (or the eye) of the optical sensor and the surface level of the polycrystal melt is maintained constant, or that the values measured by the optical sensor are corrected in response to the increase of the distance therebetween.

However, in the single crystal pulling apparatus, the surface level of the polycrystal melt in the crucible shifts downward relative to the wall of the crucible, as the single crystal ingot is pulled up. Therefore, in order to maintain constant the distance between the optical sensor and the surface level of the polycrystal melt, it is necessary that the crucible is raised to compensate for the fall of the melt surface level. For this reason in the conventional single crystal pulling apparatuses the crucible is supported in a manner such that it can be shifted vertically at arbitrary velocities, and thus during the single crystal pulling operation, the crucible is raised by means of a drive means in a manner such that the melt surface is always kept stationary relative to the optical sensor.

PROBLEMS THE INVENTION SEEKS TO SOLVE

However, in the conventional operation, such raising of the crucible is carried out only when the shoulder portion or the cylindrical portion of the single crystal ingot is being pulled up from the polycrystal melt and not when the conical portion is being grown out of the melt, and furthermore, the crucible raising velocity is set to a value which is proportional to the velocity of the ascending pull shaft on the assumption that actual diameter of the single crystal ingot being pulled up at the solid-liquid interface is equal to the aimed diameter. Consequently, the fall of the melt surface level caused by the growth of the conical portion of the single crystal ingot is not compensated for so that the distance between the optical sensor and the melt surface level is increased during this period, and furthermore, even though the crucible is raised as the cylindrical or the shoulder portion of the ingot is pulled up, the difference between the actual diameter of the single crystal being pulled up and the aimed diameter gives rise to over-compensation or short-compensation of the melt surface fall with the result that the distance between the optical sensor and the melt surface level changes incessantly and renders it impossible for the optical sensor to conduct precision measurement of the single crystal diameter.

The present invention was contrived in view of the above problems and it is, therefore, an object of the invention to provide an ingot diameter measuring method which is capable of measuring a diameter of a single crystal ingot pulled up in a single crystal pulling apparatus with improved precision.

SUMMARY OF THE INVENTION

Means to Solve the Problems

In order to attain the above objects and others, the present inventors propose an improved method for measuring a diameter of a single crystal ingot pulled up in a single crystal pulling apparatus in which the ingot diameter is measured by means of an optical sensor. According to the invention, the improvement lies in that the approximate weight of the growing single crystal is continually calculated, and from the calculated weight of the grown single crystal the descent amount of the surface level of the molten polycrystal substance relative to the crucible wall is calculated, and an adjustmental operation is conducted to correct the measurement of the optical sensor in response to the descent amount of the surface level of the molten polycrystal substance.

In one embodiment of the invention, the adjustmental operation is to correct the value of the ingot diameter actually measured by the optical sensor in response to the descent amount of the surface level of the molten polycrystal substance. The manner of correcting the actually measured value of the ingot diameter is to be determined by known methods. For example, the descent amount of the surface level is used to find out the true distance L between the head of the optical sensor and the surface level, and the method of trigonometry is applied to the right triangle whose hypotenuse is the line connecting the head of the optical sensor and the point of the edge of the solid-liquid interface closest to the optical sensor and whose base is included in the melt surface so that the size of the base of the right triangle is calculated, which will directly give the size of the diameter of the single crystal ingot at the solid-liquid interface. In reality, however, a large number of data are calculated and stored beforehand to be used as the correction factors with respect to different distances between the optical sensor head and the surface level of the molten polycrystal substance.

In a second embodiment of the invention, the adjustmental operation is to raise the crucible by an amount equal to the descent amount of the surface level of the molten polycrystal substance.

RESULTS OF THE INVENTION

Consequently, according to the invention, since the ever increasing weight of the growing single crystal is always calculated and used to calculate the descent amount of the surface level of the molten polycrystal substance relative to the crucible wall, and since the adjustmental operation is conducted based on the obtained descent amount of the surface level, not only the lowering of the surface level attributable to the growth of the conical portion of the single crystal ingot, which was formerly ignored, is now taken in consideration in the adjustmental operation, but also the problem that was attributed to the difference between the actual diameter of the single crystal being pulled up and the hypothetical aimed diameter, which latter is no longer used anywhere in the present method, is now not relevant to this new method, so that it is now possible to obtain highly accurate values of the ingot diameter.

In particular, according to the invention, the descent amount of the surface level of the molten polycrystal substance relative to the crucible wall is always known, so that it is possible to maintain the distance between the optical sensor and the melt surface level at a constant value by raising the crucible at controlled velocities, or optionally it is possible also to correct the ingot diameter value measured by the optical sensor in response to the descent amount of the surface level without moving the crucible. As the result, all the problems stated above are solved by this invention and it has become possible to obtain a single crystal ingot of highly uniform diameter.

BRIEF DESCRIPTION OF THE DRAWINGS

These and other effects of the invention will be realized by reference to the description, taken in connection with the accompanying drawings, in which.

EMBODIMENTS

Next, a first embodiment of the invention will be described with reference to the attached drawings.

Figure 1:
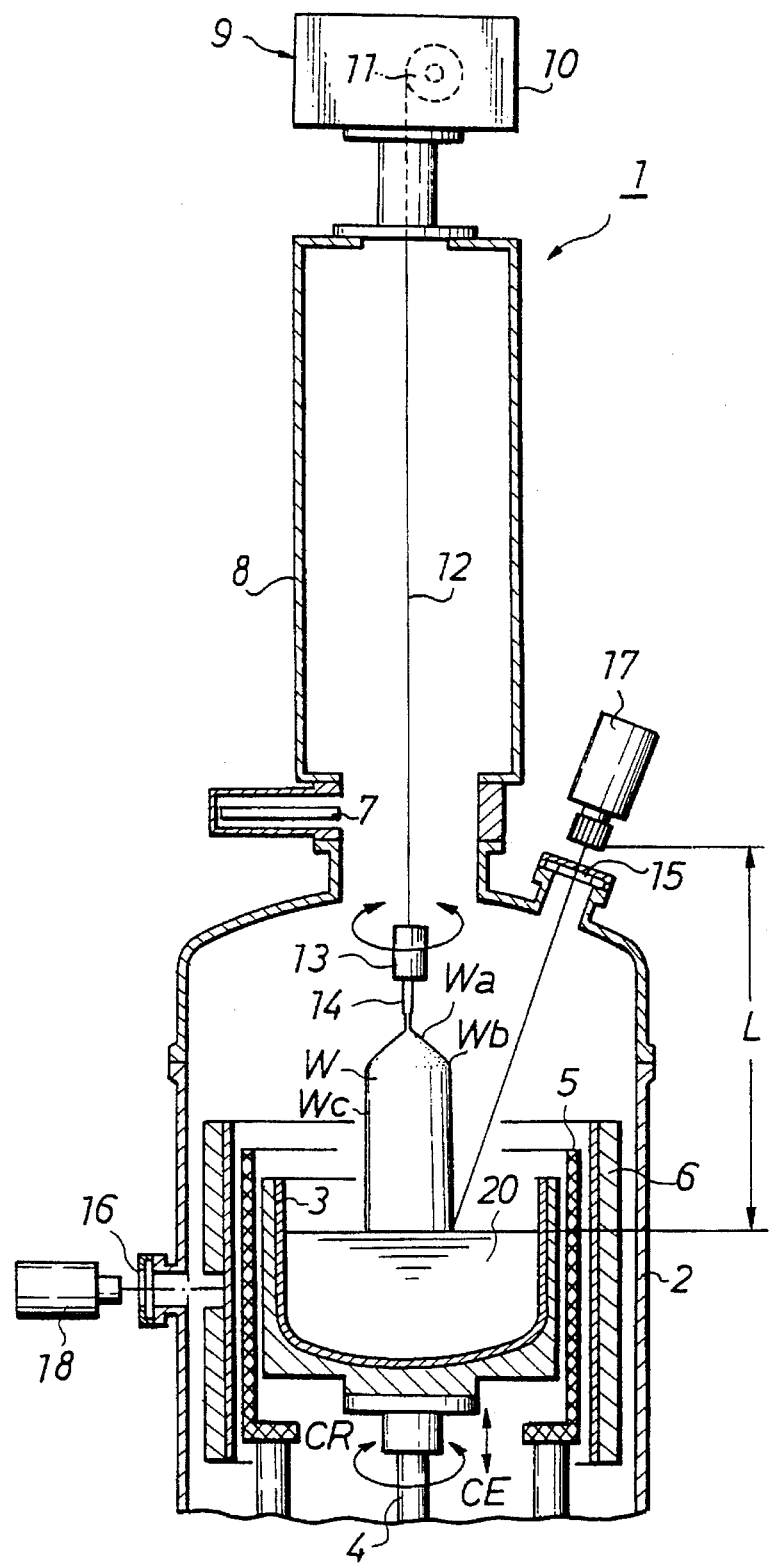
FIG. 1 is a sectional drawing showing the construction of a single crystal pulling apparatus wherein the method of the present invention is embodied.

FIG. 1 is a sectional drawing showing the construction of a single crystal pulling apparatus wherein the method of the present invention is embodied. In FIG. 1, the reference numeral 2 designates a main chamber (water-cooled heating chamber) comprising mainly of a stainless cylinder. Inside the main chamber 2 is a quartz crucible 3 which is fixed on top of a vertical crucible shaft 4, which shaft 4 is adapted to turn about its axis and shift vertically. Surrounding this crucible 3 is a cylindrical heater 5 made of carbon, and a cylindrical thermal insulator 6 also made of carbon. All of these elements 3, 4, 5, and 6 are generally in coaxial alignment. Incidentally, the interior of the crucible 3 is shaped exactly cylindrically except for the bottom portion. Also, the crucible 3 is driven by a drive means, not shown, in a manner such that the crucible 3 is turned about the axis of the crucible shaft 4 at a rotational velocity of CR and is shifted vertically at a velocity of CE.

A pull chamber 8 is provided on top of the main chamber 2 in a coaxial alignment, and an isolation valve 7 is provided between the two chambers 2, 8. A winder assembly 9 is provided at the top portion of the pull chamber 8. The pull chamber 8 comprises a stainless cylinder, and is for receiving in it the pulled-up grown single crystal ingot, and for providing a lateral exit for the ingot.

A box 10 of the winder assembly 9 is adapted to rotate horizontally relative to the pull chamber 8 together with a wire winder drum 11 which is provided in the box 10. The wire winder drum 11 is rotated by a DC servomotor, not shown, so as to selectively wind up and unwind a pull wire 12.

The pull wire 12 is wound round the drum 11, and a part of it is unwound to suspend vertically past the pull chamber 8 and into the main chamber 2. A seed holder 13 is provided at the lower end of the wire 12 for holding a seed crystal 14.

A sight glass 15 is provided in the roof of the main chamber 2, and an image sensor 17, which is an optical diameter detecting means, is provided in the vicinity of the sight glass 15 to peep therethrough. Another sight glass 16 is provided in the side wall of the main chamber 2, and an optical temperature detecting sensor 18 is provided at the sight glass 16 to peep therethrough.

Next, the operation of the single crystal pulling apparatus 1 will be described with reference to FIG. 1.

At the beginning of the single crystal pulling operation, the isolation valve 7 is opened to thereby render the main chamber 2 and the pull chamber 8 into communication. Then, an inert gas such as argon is supplied into the main chamber 2, and the single crystal pulling operation is carried out in this inert gas atmosphere.

Polycrystal raw material such as silicon is charged in the crucible 3 wherein it is melted down by the heater 5 to form a molten liquid 20. Then, the wire drum 11 is caused to turn in the direction of unwinding the pull wire 12. Thus, the wire 12 is lowered gradually, and the seed crystal 14 held by the seed holder 13 fixed at the lower end of the wire 12 is dipped in the molten liquid 20 contained in the crucible 3.

Next, the crucible shaft 4 and the crucible 3 supported thereon are caused to rotate about their common axis of rotation at the predetermined rate CR. Simultaneously with this, the wire winder drum 11 of the winder assembly 9 is caused to turn and wind up the pull wire 12 at a predetermined rate SE, and the box 10 of the winder assembly 9 is caused to turn around its rotation axis; thus, the pull wire 12 also spins together with the box 10 at a predetermined rate. As a result, the pull wire 12 rises and spins at the same time, and a single crystal sprouts from the seed crystal 14 provided at the seed holder 13 at the end of the pull wire 12, and is grown into an ingot W, as shown in the figure.

Now, the diameter of that part of the single crystal ingot W which is being grown in the solid/liquid interface of the melt 20 is measured by means of the optical sensor, namely the image sensor 17. This optical sensor may be an ITV. In order for the image sensor 17 to achieve an accurate diameter measurement, it is required that the distance L between the head of the image sensor 17 and the surface of the melt 20 is constant. However, as the single crystal W is pulled up longer, the surface level of the melt 20 lowers relative to the wall of the crucible 3; therefore, in order to compensate for the lowering of the melt level, the crucible 3 is raised at the rate CE which is calculated to be the same rate at which the melt level lowers relative to the crucible wall. Hence, the distance L between the head of the image sensor 17 and the surface level of the melt 20 is supposed to be maintained constant.

However, in the conventional operation, as stated above, such raising of the crucible 3 is carried out only when the shoulder portion Wb or the cylindrical portion Wc of the single crystal ingot W is being grown and pulled out from the polycrystal melt 20 and not when the conical portion Wa is grown out of the melt 20, so that while the conical portion Wa is raised from the melt 20 the lowering of the melt level relative to the crucible wall is not compensated for by the rise of the crucible 3. As a result, the distance L between the head of the image sensor 17 and the surface level of the melt 20 is increased and the accuracy of the diameter measurement is affected.

In the procedure of the present embodiment, the weight WE(n) of that part of the conical portion Wa of the single crystal which has been pulled up from the melt 20 is calculated, and this pulled-up weight WE(n) is then divided by the weight WE0 of the polycrystal melt which would occupy a unit depth in the crucible 3 at any level except at the bottom, and the result ML(n) is the depth by which the melt level has shifted downward in the crucible 3, which is therefore the length by which the distance L is increased. The value of the diameter measured by the image sensor 17 is then corrected by the value ML(n).

The pulled-up weight WE(n) of the single crystal conical portion Wa is obtained in the following manner.

Figure 2:
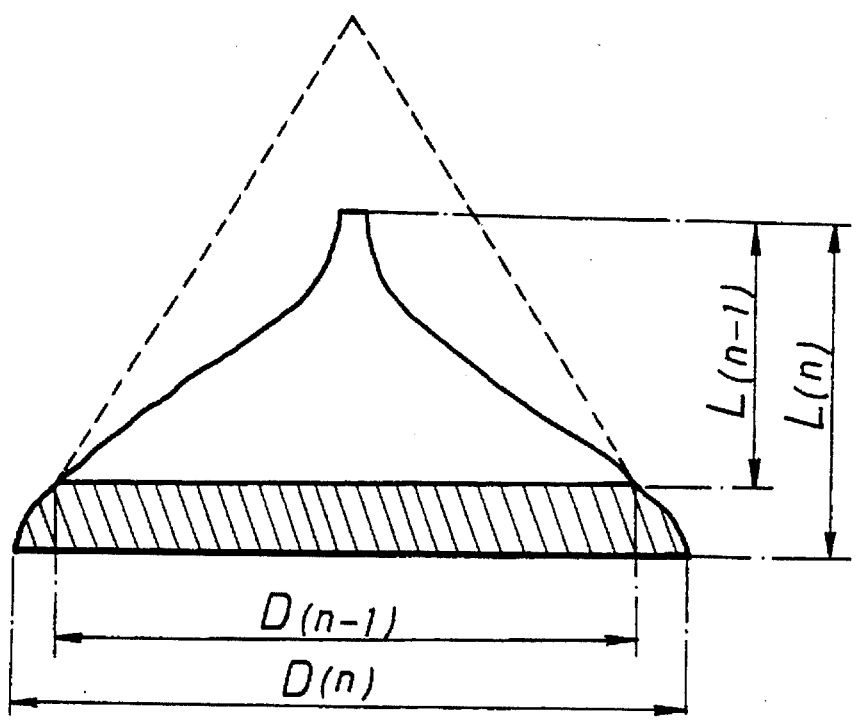
FIG. 2 is a drawing showing a model to be referred to in the explanation of the calculation of the pulled-up weight of the conical portion of the single crystal.

Let the lapse of time from the start of the single crystal pulling operation be t as counted by integer n (n=1, 2, 3 . . . ); let the incremental weight of the single crystal W, by which the weight of the grown single crystal W increases as the unit time of one-count length passes, as of the time point of t=n be dWE(n); let the diameter which is measured then by the image sensor 17 be D(n); let the length of the single crystal W which has been grown by then be L(n); then, assuming that the body hatched in FIG. 2 which is grown as time passes from n−1 to n is a true truncated cone, the incremental weight dWE(n) of the growing conical portion Wa is given by the following equation:

$$dWE_{(n)} = \frac{\pi \cdot \rho_0}{12} (L_{(n)} - L_{(n-1)}) \cdot (D_{(n)}^2 + D_{(n)} \cdot D_{(N-1)} + D_{(n-1)}^2) \quad (1)$$

wherein ρ0 is the density of the single crystal W.

Thus, the summed weight WE(n) of the conical portion Wa which has been pulled up above the melt surface by the time t=n is given as follows:

$$WE(n) = \sum_{n=1}^{n} dWE(n) \quad (2)$$

The melt surface descent ML(n) is then obtained by dividing the pulled-up weight WE(n) resulting from Equation (2) by the value WE0 as given in the following Equation (3), which WE0 is the weight of the polycrystal melt 20 which would occupy a unit depth Δh in the crucible 3 at any level except at the bottom thereof.

$$WE0 = \frac{\pi \cdot \rho_1}{4} \cdot D c^2 \cdot \Delta h \quad (3)$$

wherein Dc is the inner diameter of the crucible 3, and ρ1 is the density of the polycrystal melt 20.

$$ML(n) = \frac{WE(n)}{WE0} \quad (4)$$

The value of the diameter actually measured by the image sensor 17 is corrected in response to the melt surface descent ML(n) as calculated by Equation (4), and accordingly, the error which is attributable to the failure of considering the melt surface descent which results from pulling up of the conical portion Wa of the single crystal is rectified and a highly accurate diameter measurement is attained.

Next, a second embodiment of the invention will be described.

Up until the melt surface descent ML(n) is obtained by means of Equation (4) the procedure of this embodiment is identical to that of the first embodiment. The second embodiment differs from the first embodiment in that instead of rectifying the value of the diameter of the single crystal ingot actually measured by the image sensor 17, the crucible 3 is raised by the amount of melt surface descent ML(n) whereby the distance L between the head of the image sensor 17 and the surface level of the melt 20 is maintained unchanged.

Since in the second embodiment, the distance L between the head of the image sensor 17 and the surface level of the melt 20 is maintained unchanged, the accuracy of the measurement of the diameter of the single crystal ingot W by means of the optical sensor 17 is maintained high.

EFFECTS OF THE INVENTION

As is clear from the above description, according to the invention, in a method for measuring a diameter of a single crystal ingot pulled up in a single crystal pulling apparatus by means of an optical sensor, the pulled-up weight of the single crystal is calculated, and the descent of the melt surface in the crucible is calculated from this pulled-up weight, and thereafter either the value of the diameter actually measured by the image sensor is corrected in response to the melt surface descent or the crucible is raised as much as the melt surface descent, it is now possible to improve the accuracy of the measurement of the diameters of the single crystal ingot pulled up in a single crystal pulling apparatus.

The invention being thus described, it will be obvious that the same may be varied in many ways. Such variations are not to be regarded as a departure from the spirit and scope of the inventions, and all such modifications as would be obvious to one skilled in the art are intended to be included within the scope of the following claims.

What is claimed is:

1. A method for measuring a diameter of a single crystal ingot pulled up from a molten polycrystal substance contained in a crucible having a cylindrical hollow in a crystal pulling apparatus in which an ingot diameter is measured by means of an optical sensor, comprising the steps of calculating an approximate weight of the pulled-up single crystal, calculating a descent amount of a surface level of the molten polycrystal substance relative to a wall of the crucible from said approximate pulled-up weight of the grown single crystal, and conducting an adjustment operation to obtain the correct value of the ingot diameter from the measurement of the optical sensor, in response to the descent amount of the surface level of the molten polycrystal substance.

2. The method as claimed in claim 1 wherein said descent amount of the surface level of the molten polycrystal substance is obtained by dividing the pulled-up weight of the single crystal ingot by the weight of a volume of the molten polycrystal substance which would occupy a unit depth in the crucible.

3. The method as claimed in claim 2 wherein said adjustmental operation is to correct the value of the ingot diameter actually measured by the optical sensor in response to the descent amount of the surface level of the molten polycrystal substance.

4. The method as claimed in claim 2 wherein said adjustmental operation is to raise the crucible by an amount equal to the descent amount of the surface level of the molten polycrystal substance.

5. A method as recited in claim 1, wherein said step of calculating an approximate weight of the pulled-up single crystal includes a calculation of the approximate weight of a conical portion of said pulled-up single crystal.

6. A method as recited in claim 1, wherein said step of calculating an approximate weight of the pulled-up single crystal includes a step of calculating an approximate weight of a volume defined by a diameter of said single crystal ingot measured at a first time and a diameter of said single crystal ingot measured at a second time subsequent to said first time as said single crystal ingot is pulled up and a length by which said single crystal ingot is pulled up between said first time and said second time.

7. A method as recited in claim 5, wherein said step of calculating an approximate weight of the pulled-up single crystal includes a calculation of the approximate weight of a volume of a conical portion of said pulled-up single crystal.

8. A method as recited in claim 6, wherein said step of calculating an approximate weight of the pulled-up single crystal includes the further step of approximating a volume of said single crystal ingot as a truncated cone.

9. A method as recited in claim 7, wherein said step of calculating an approximate weight of the pulled-up single crystal includes the further step of calculating an approximate weight of a volume of substantially constant diameter.

10. A method as recited in claim 8, wherein said step of calculating an approximate weight of the pulled-up single crystal includes the further step of calculating an approximate weight of a volume of substantially constant diameter.

11. A method of correcting or compensating an optical measurement of diameter of a single crystal ingot during growth in which the single crystal ingot is pulled up from a melt at a surface thereof, said method comprising the steps of a.) measuring the diameter of said crystal ingot, b.) computing a weight of a pulled up portion of said crystal ingot, c.) calculating a descent amount of said surface of said melt corresponding to said weight computed in step b.), d.) correcting or compensating said optical measurement by at least one of altering a location of said surface of said melt and adjusting said optical measurement in accordance with said descent amount.

* * * * *